(12) United States Patent
Yuge

(10) Patent No.: US 6,309,459 B1
(45) Date of Patent: Oct. 30, 2001

(54) COMPOUND SEMICONDUCTOR ELEMENT AND ITS MANUFACTURING METHOD

(75) Inventor: Shozo Yuge, Chigasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/624,419

(22) Filed: Jul. 24, 2000

Related U.S. Application Data

(62) Division of application No. 09/123,459, filed on Jul. 28, 1998, now abandoned.

(30) Foreign Application Priority Data

Jul. 29, 1997 (JP) .................................................. 9-202772

(51) Int. Cl.$^7$ .................................................. C30B 25/10
(52) U.S. Cl. .................................................. 117/105
(58) Field of Search .................................. 117/105, 88

(56) References Cited

U.S. PATENT DOCUMENTS

| | | | | |
|---|---|---|---|---|
| 5,274,251 | * | 12/1993 | Ota et al. .................................. | 257/78 |
| 5,476,811 | * | 12/1995 | Fujii et al. .................................. | 432/105 |
| 5,559,058 | * | 9/1996 | Zory, Jr. et al. ....................... | 437/237 |
| 5,592,501 | * | 1/1997 | Edmond et al. ......................... | 372/45 |
| 5,646,953 | * | 7/1997 | Naito et al. ............................. | 372/46 |
| 5,670,798 | * | 9/1997 | Schetzina ................................. | 257/96 |
| 5,859,864 | * | 1/1999 | Jewell ...................................... | 372/45 |
| 5,902,393 | * | 5/1999 | Nido et al. ................................ | 117/2 |
| 5,995,527 | * | 11/1999 | Ueta et al. ............................... | 372/45 |
| 6,072,189 | * | 6/2000 | Duggan .................................... | 257/14 |
| 6,156,581 | * | 12/2000 | Vaudo et al. ............................ | 438/22 |

\* cited by examiner

*Primary Examiner*—Benjamin L. Utech
*Assistant Examiner*—Matthew Anderson
(74) *Attorney, Agent, or Firm*—Oblon, Spivak, McClelland, Maier & Neustadt, P.C.

(57) ABSTRACT

A compound semiconductor light emitting element has a unique SCH structure having InGaN graded layers with a gradiunt in content of In interposed between an InGaN active layer and AlGaN cladding layers to ensure a good crystallographic property of the active layer, to maintain and hetero interfaces on and above the active layer in a good condition and to prevent fluctuation in thickness of the active layer, so that a compound semiconductor light emitting element with a high emission efficiency and reliability or a laser element with a high slope efficiency and reliability be obtained. The InGaN graded layers with gradually changed In compositions can be made by increasing or decreasing the temperature while maintaining the supply amount or the ratio of the In source material relative to the supply amount of the other group III source materials in a constant value.

14 Claims, 8 Drawing Sheets

(a)

(b)

COMPOUND SEMICONDUCTOR ELEMENT AND ITS MANUFACTURING METHOD

This application is a Divisional of U.S. application Ser. No. 09/123,459 filed on Jul. 28, 1998, now abandoned.

BACKGROUND OF THE INVENTION

This invention relates to a GaN semiconductor element used as a light source, for example, of an indicating lamp, full color display or DVD (Digital Versatile Disc)system, and its manufacturing method.

GaN and other nitride semiconductors are practically useful as semiconductors to make blue-color diodes, blue-color laser diodes, and so forth. $In_xGa_{1-x}N$, among them, can be changed in band gap in the range from 2 eV to 3.4 eV by adjusting the mole fraction x of In, and is especially remarked as a hopeful material of light emitting elements for light in the visible band.

In the present application, "nitride semiconductors" involve III–V compound semiconductors expressed by $B_xIn_yAl_zGa_{(1-x-y-z)}N$ ($0 \leq x \leq 1$, $0 \leq y \leq 1$, $0 \leq z \leq 1$), and involves mixed crystals including phosphorus (P) or arsenic (As) in addition to N as the group V element.

Double-heterostructures using an $In_xGa_{1-x}N$ layer, such as structures sandwiching an $In_xGa_{1-x}N$ active layer between AlGaN cladding layers, are effective for confinement of injected carriers and light, and are employed to made light emitting elements for a high luminance or a short wavelength.

Explained below are a semiconductor light emitting element with a double-heterostructure using an InGaN layer as its active layer and a method for manufacturing same.

FIG. 12 is a cross-sectional view schematically showing the semiconductor light emitting element of a double-heterostructure including a InGaN active layer and AlGaN cladding layers. FIGS. 13A through 13D are cross-sectional views schematically showing the semiconductor light emitting element of FIG. 12 under different steps of its manufacturing process.

As shown in FIG. 12, sequentially stacked on a sapphire substrate 21 are a GaN buffer layer 22, n-type $Al_yGa_{1-y}N$ cladding layer 23 ($0 \leq y \leq 1$), $In_xGa_{1-x}N$ active layer 25 ($0 \leq x \leq 1$), p-type $Al_zGa_{1-z}N$ cladding layer 27 ($0 \leq z \leq 1$) and p-type GaN layer 28 which are stacked sequentially on a sapphire substrate 21.

These layers are typically grown by MOCVD (Metal-Organic Chemical Vapor Deposition) in the following process. In the explanation made below, the sapphire substrate 21 is named substrate 21, and mole fractions x, y and z of layers are omitted.

The substrate 21 is first introduced into a MOCVD reactor, and annealed in a flow of hydrogen gas at 1100° C. for 10 minutes. After that, the temperature of substrate 21 is decreased to 520° C., and the GaN buffer layer 22 is grown to 50 nm on the surface of the substrate 21 (see FIG. 13A).

Then, the substrate 21 is heated to 1100° C., and the n-type AlGaN cladding layer 23 is grown to 4 μm, maintaining the temperature at 1100° C. (see FIG. 13B).

Thereafter, the temperature of the substrate 21 is decreased to 750° C., and the InGaN active layer 25 is grown to 0.1 μm, maintaining the temperature at 750° C. (see FIG. 13C).

Then, the substrate 21 is heated to 1100° C., and the p-type AlGaN cladding layer 27 of 0.15 μm and the p-type GaN contact layer 28 of 0.3 μm are grown under the constant temperature of 1100° C. Thus the light emitting element with a double-heterostructure is formed (see FIG. 13D).

For growth of the cladding layer 23 and 27, the temperature must be set at about 1000° C. which is higher by 200 through 350° C. than the growth temperature for the InGaN active layer 25. That is, before and after the growth of the InGaN active layer 25, the temperature of the substrate 21 had to be increased and decreased. Because of GaN having the melting temperature of about 1000° C. and InN having the melting point of about 500° C., the process involved the following problems.

1. Decomposition of InN occurs in the InGaN active layer 25 in the process of increasing the temperature. GaN, however, is very unlikely to be decomposed. Therefore, the InGaN active layer 25 is partly replaced by GaN, and its crystallographic property deteriorates.

2. Decomposition of InN in InGaN in the process of increasing the temperature results in decreasing the thickness of the InGaN active layer 25.

3. The hetero-interface between the cladding layer 23 and the InGaN active layer 25 degrades due to the problems 1 and 2 indicated above in the process of increasing the temperature.

4. In the process of decreasing the temperature, an unintentional InGaN layer not having the predetermined mole fraction of In may be grown, and the hetero-interface between the active layer 25 and the cladding layer 27 may degrade.

Deterioration of the crystallographic property of the active layer 25 and degradation of the hetero-interface invite a decrease in emission efficiency of light emitting elements and an increase in threshold value of laser elements. Further, the decrease in thickness of the InGaN active layer 25 means a structural deviation of the element from a designed value, and it invited degradation of initial characteristics and reliability of light emitting elements.

SUMMARY OF THE INVENTION

It is therefore an object of the invention to provide a unique SCH structure (Separate-Confinement Heterostructure) promising a good crystallographic property of the active layer and good hetero-interfaces on and under the active layer, and preventing changes in thickness of the active layer, to realize compound semiconductor light emitting elements with a high emission efficiency and reliability or laser elements with a high slope efficiency and reliability.

According to the invention, there is provided a compound semiconductor element comprising:

a first cladding layer made of a nitride semiconductor having a first band gap;

a first graded layer formed on the first cladding layer;

an active layer formed on the first graded layer and having a second band gap narrower than the first band gap;

a second graded layer formed on the active layer; and a second cladding layer formed on the second graded layer and made of a nitride semiconductor having a third band, gap wider than the second band gap, the first graded layer being made of a nitride semiconductor to become gradually narrower in band gap from a portion nearest to the first cladding layer toward a portion nearest to the active layer within the range from the first band gap to this second band gap, and the second graded layer being made of a nitride semiconductor to become gradually wider in band gap from a portion nearest to the active layer toward a portion nearest to the second cladding layer within the range from the second band gap to the third b and gap.

As a preferred embodiment of the invention, said first cladding layer is made of $Al_yGa_{1-y}N$ ($0 \leq y \leq 1$), said first graded layer is made of $In_uGa_{1-u}N$ ($0 \leq u \leq 1$), said active layer is made of $In_xGa_{1-x}N$ ($0 \leq x \leq 1$), said second graded layer is made of $In_wGa_{1-w}N$ ($0 \leq w \leq 1$), and said second cladding layer is made of $Al_zGa_{1-z}N$ ($0 \leq z \leq 1$).

As an another preferred embodiment of the invention, said first cladding layer is made of $Al_yGa_{1-y}N$ ($0 \leq y \leq 1$), said first graded layer is made of $GaN_{uP1-u}$ ($0 \leq u \leq 1$), said active layer is made of $GaN_{xP1-x}$ ($0 \leq x \leq 1$), said second graded layer is made of $GaN_wP_{1-w}$ ($0 \leq w \leq 1$), and said second cladding layer is made of $Al_zGa_{1-z}N$ ($0 \leq z \leq 1$).

The method for manufacturing a compound semiconductor element comprising a step of growing a compound semiconductor layer having a gradually changing content of indium along the growth direction by changing the growth temperature while maintaining the supplying ratio of a source material of indium relative to the source materials of the other group III elements in a constant value.

As a preferred embodiment of the invention, said compound semiconductor layer is grown by increasing the growth temperature to gradually decrease the content of indium along the growth direction.

Also it is preferred that a source material of a group V element is further used, and the ratio of the supply amount of the source material of the group V element relative to the supply amount of the source material of the group III element (V/III ratio) is gradually increased.

Also it is preferred that when said group V element is nitrogen (N), said V/III ratio is not smaller than 1000; when said group V element is phosphorus (P), said V/III ratio is not smaller than 150; and when said group V element is arsenic (As), said V/III ratio is not smaller than 50.

As an another preferred embodiment of the invention, said compound semiconductor layer is grown by decreasing the growth temperature to increase the content of indium along the growth direction.

It is also preferred that a source material of a group V element is further used, and the ratio of the supply amount of the source material of the group V element relative to the supply amount of the group III element (V/III ratio) is gradually decreased within a range having a lower limit of a predetermined value.

It is also preferred that when said group V element is nitrogen (N), said predetermined value of the V/III ratio is 1000; when said group V element is phosphorus (P), said predetermined value of the V/III ratio is 150; and when said group V element is arsenic (As), said predetermined value of the V/III ratio is 50.

Another embodiment of the invention comprises:

a first step of growing an $Al_yGa_{1-y}N$ cladding layer ($0 \leq y \leq 1$) of a first conduction type on a substrate at a growth temperature T1;

a second step of growing on said first $Al_yGa_{1-y}N$ cladding layer of the first conduction type an $In_uGa_{1-u}N$ graded layer ($0 \leq u \leq 1$) having a gradually increased content of indium (In) along the growth direction by decreasing the growth temperature from T1 to T2 while supplying a source material of gallium (Ga) and a source material of indium (In) in a substantially constant ratio therebetween;

a third step of growing an $In_xGa_{1-x}N$ active layer ($0 \leq x \leq 1$) at a constant growth temperature T3;

a fourth step of growing an $In_wGa_{1-w}N$ graded layer ($0 \leq w \leq 1$) having a gradually decreased content of indium (In) along the growth direction by increasing the growth temperature from T4 to T5 while supplying a source material of gallium (Ga) and a source material of indium (In) in a substantially constant ratio therebetween; and a fifth step of growing an $Al_zGa_{1-z}N$ cladding layer of a second conduction type different from said first conduction type ($0 \leq z \leq 1$) at a constant growth temperature T5, wherein $x \leq u$, $x \leq w$, $T3 \leq T2 \leq T1$, and $T3 \leq T4 < T5$.

It is preferred that the method further comprising a step of decreasing the temperature from the temperature T2 to T3 while interrupting the supply of the source material of the group III element between said second step and said third step.

It is also preferred that the method further including a step of increasing the temperature from the temperature T3 to T4 while interrupting the supply of the source material of the group III element between said third step and said fourth step.

It is also preferred that $10 \leq D1 \leq 60$ and $10 \leq D2 \leq 60$ are satisfied where D1 (°C./minute) is the temperature gradient upon decreasing the growth temperature in said second step, and D2 (°C./minute) is the temperature gradient upon increasing the growth temperature in said fourth step.

It is further preferred that $6 \leq D1 \leq 18$ and $6 \leq D2 \leq 18$ are satisfied when $0.002 \leq V1 \leq 0.006$ and $0.002 \leq V2 \leq 0.006$ where V1 (μm/minute) is the growth rate of said graded layer in said second step, D1 (°C./minute) is the temperature gradient upon decreasing the growth temperature in said second step, V2 (μm/minute) is the growth rate of said graded layer in said fourth step, and D2 (°C./minute) is the temperature gradient upon increasing the growth temperature in said fourth step.

Said first step through said fifth step are preferably performed by using a metal-organic chemical vapor deposition and said substrate is preferably made of sapphire.

According to the invention having the above-mentioned construction overcomes the problems of deterioration at interfaces by interruption of growth at interfaces of the double-heterostructure or by re-increasing the temperature, or an increase in thickness of the InGaN active layer by a high temperature, and ensures a controllable SCH structure to be made easily with a good reproducibility.

Therefore, light emitting elements and laser elements with a very high emission efficiency and reliability can be made with a good reproducibility.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below is a semiconductor light emitting element according to the invention with reference to the drawings.

Figure 1:
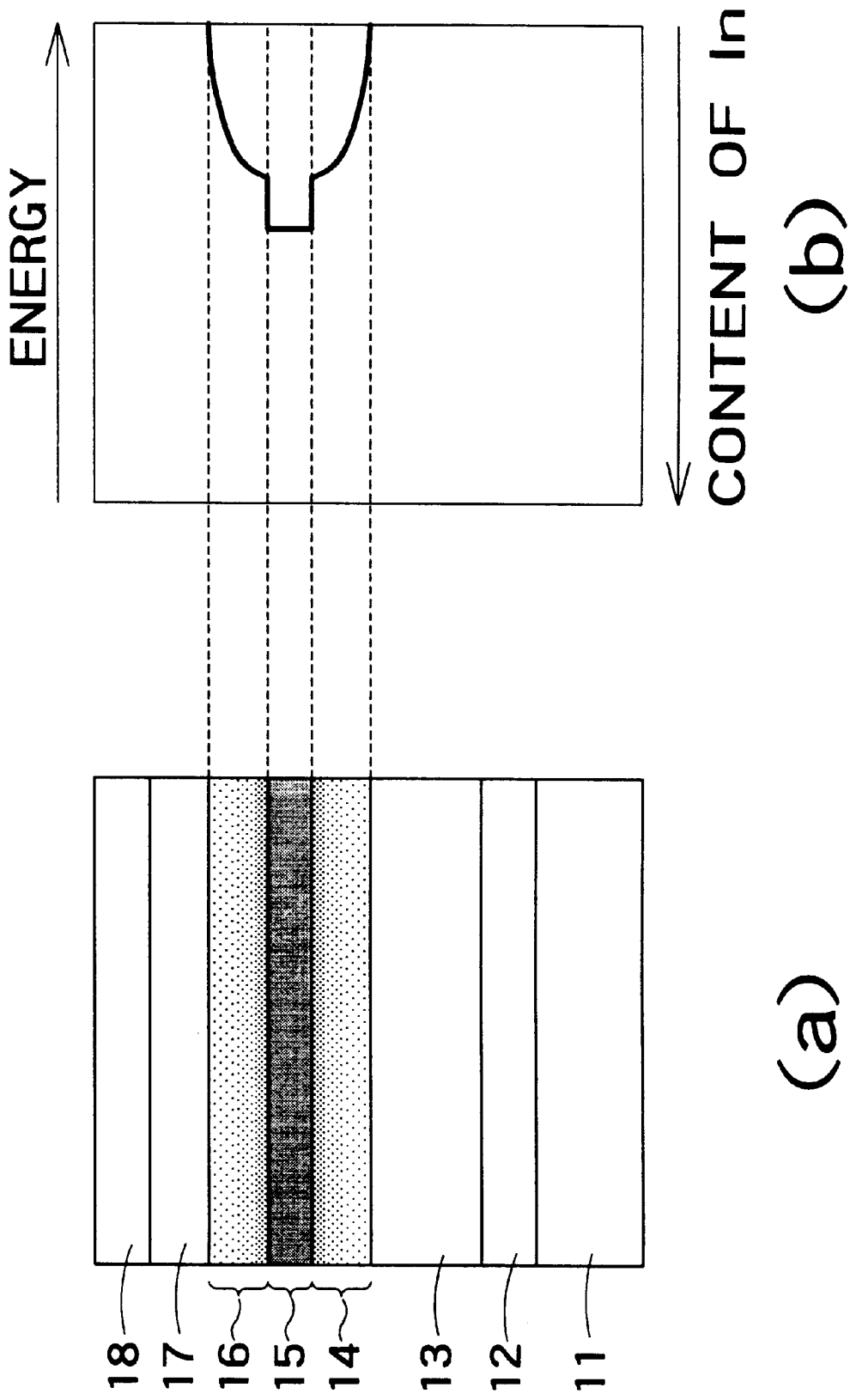
FIG. 1 is a diagram combining a cross-sectional view (a) of a semiconductor light emitting element according to an embodiment of the invention, with a corresponding profile of the content of In and the energy gap (b) in the element.
Figure 2:
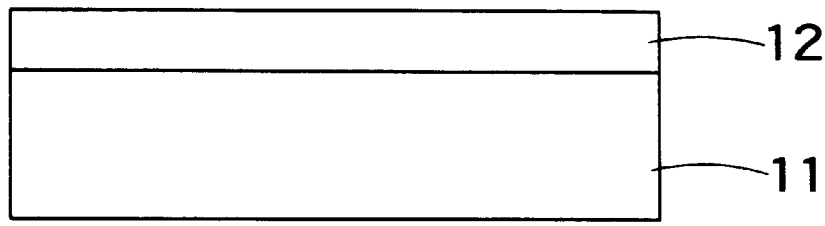
FIG. 2 is a cross-sectional view of the semiconductor light emitting element under a manufacturing process.

FIG. 1 is a diagram combining a cross-sectional view (a) schematically showing the semiconductor light emitting element embodying the invention, with a corresponding profile of the content of In and the energy gap (b) in the element. FIGS. 2 through 7 are cross-sectional views of the semiconductor light emitting element in different steps of a manufacturing process.

The compound semiconductor light emitting element according to the embodiment includes a GaN buffer layer 12, n-type $Al_yGa_{1-y}N$ cladding layer 13 ($0 \leq y \leq 1$), $In_uGa_{1-u}N$ graded layer 14 ($0 \leq u \leq 1$), $In_xGa_{1-x}N$ active layer 15 ($0 \leq x \leq 1$), $In_wGa_{1-w}N$ graded layer 16 ($0 \leq w \leq 1$), p-type $Al_zGa_{1-z}N$ cladding layer 17 ($0 \leq z \leq 1$) and p-type GaN contact layer 18, sequentially stacked on a sapphire substrate 11.

The content of indium (In) in the $In_uGa_{1-u}N$ graded layer 14 and the $In_wGa_{1-w}N$ graded layer 16 increases as being closer to the $In_xGa_{1-x}N$ active layer 15, and these layers have substantially the same compositional gradient of indium. The content of In in the $In_xGa_{1-x}N$ active layer 15 is higher than the graded layers 14, 16 (see (b) in FIG. 1) so that the energy gap of the active layer 15 becomes smallest in the heterostructure.

In FIGS. 1 through 7, the shading in the graded layers 14 and 16 schematically indicates that the content of indium becomes higher as the shading gets darker. In the active layer 15, however, the shading does not correspond quantitatively to the content of indium.

In the semiconductor light emitting element according to the embodiment, since the InGaN graded layers gradually varying in content of In (having the graded content) are interposed between the InGaN active layer 15 and the p-type and n-type AlGaN cladding layers 13, 17, the hetero-interfaces on and under the active layer 15 can be maintained in a good condition. Additionally, by interposing the graded layers 14, 16, the lattice mismatching between the active layer 15 and the cladding layers 13, 17 are alleviated.

Besides, the misfits of the conduction band and the valence band at the hetero-interfaces, which cause the carrier trapping, are alleviated. Therefore, electrons and holes are efficiently confined in the active layer 15 to improve the emission efficiency.

The embodiment promises a semiconductor light emitting element with a higher emission efficiency and reliability of a laser element with a higher slope efficiency and reliability than those of conventional elements.

Next explained is a process for manufacturing the semiconductor light emitting element according to the first embodiment of the invention with reference to the drawings.

Here is used MOCVD for growth of respective layers. Usable as source material gases are ammonia ($NH_3$) for nitrogen (N), trimethyl indium (TMI) for indium (In), trimethyl gallium (TMG) for gallium (Ga), and trimethyl aluminum (TMA) for aluminum (Al). Bis-cyclopentadienile-magnesium ($Cp_2Mg$) is used as a p-tppe dopant, and hydrogen and nitrogen are used as a carrier gas. The flow rate of $NH_3$ is 5 L/min, and the flow rate of the carrier gas is 15 through 25 L/min.

The sapphire substrate 11 is first introduced into a MOCVD reactor, and annealed under a flow of hydrogen at 1100°C. for 10 minutes. Subsequently, the substrate 11 is cooled to 520°C., and the GaN buffer layer 12 is grown up to 50 nm on the surface of the sapphire substrate 11 (see FIG. 2).

The substrate 11 is then heated to 1100°C., and the n-type $Al_yGa_{1-y}N$ cladding layer 13 is grown to 4 $\mu$m under the constant temperature of 1100°C. (see FIG. 3).

Figure 4:
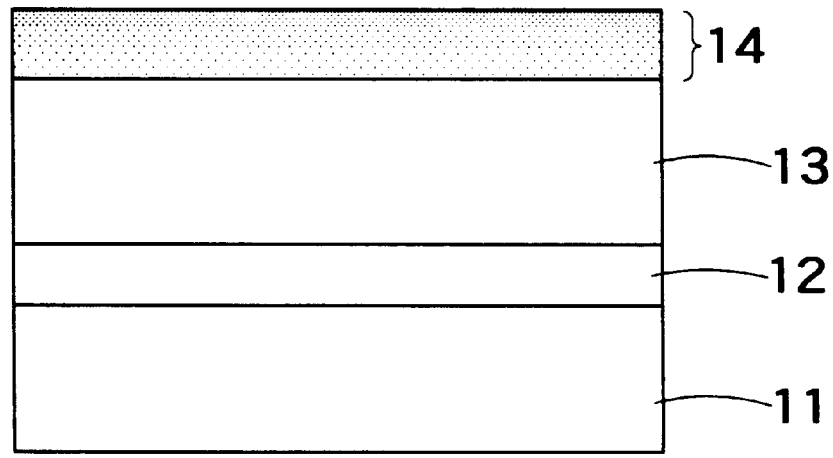
FIG. 4 is a cross-sectional view of the semiconductor light emitting element under a manufacturing process.

Thereafter, the temperature is decreased to and maintained in a degree (for example, 700°C. through 800°C.) enabling growth of the $In_xGa_{1-x}N$ active layer 15, the $In_uGa_{1-u}N$ InGaN graded layer 14 with progressively increasing In content is grown by changing the flow rate of the material gases for In and Ga (see FIG. 4).

Figure 5:
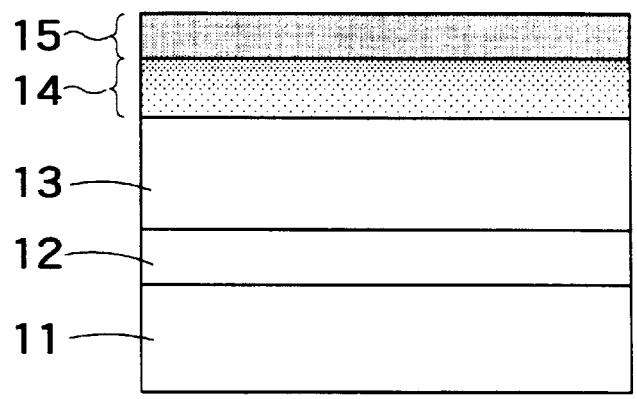
FIG. 5 is a cross-sectional view of the semiconductor light emitting element under a manufacturing process.

After that, maintaining the temperature constant, the $In_xGa_{1-x}N$ active layer 15 is grown to 0.1 $\mu$m (see FIG. 5).

Figure 6:
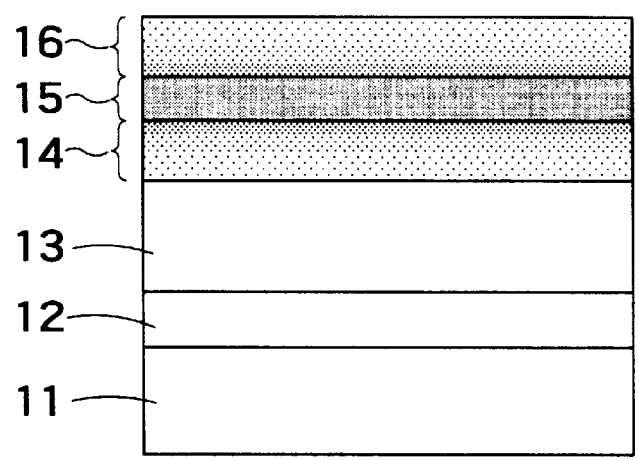
FIG. 6 is a cross-sectional view of the semiconductor light emitting element under a manufacturing process.

Subsequently, maintaining the temperature constant, $In_wGa_{1-w}N$ graded layer 16 with progressively increasing In content is formed by changing the flow rate of the material gases for In and Ga (see FIG. 6).

Figure 7:
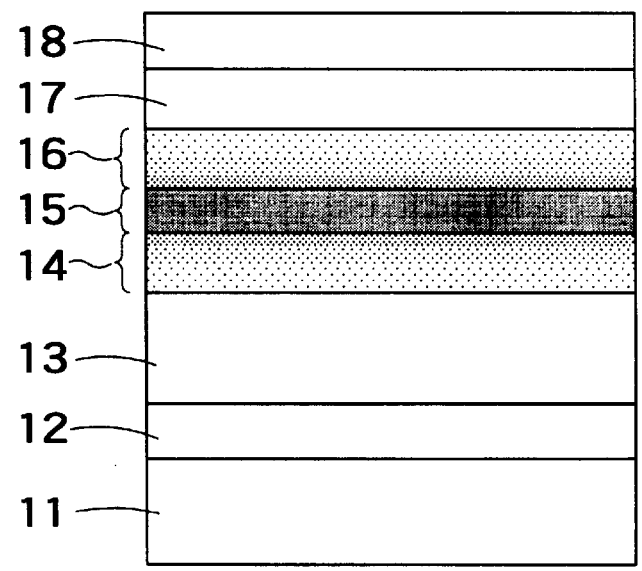
FIG. 7 is a cross-sectional view of the semiconductor light emitting element under a manufacturing process.

After that, the p-type $Al_zGa_{1-z}N$ cladding layer 17, and the p-type GaN contact layer 18 are grown (see FIG. 7). Then, a p-side electrode and an n-side electrode (not shown) are formed, the bottom surface of the sapphire substrate 11 is wrapped, the product is cut into pellets by dicing, and each pellet is molded in a resin to complete the semiconductor light emitting element.

Figure 8:
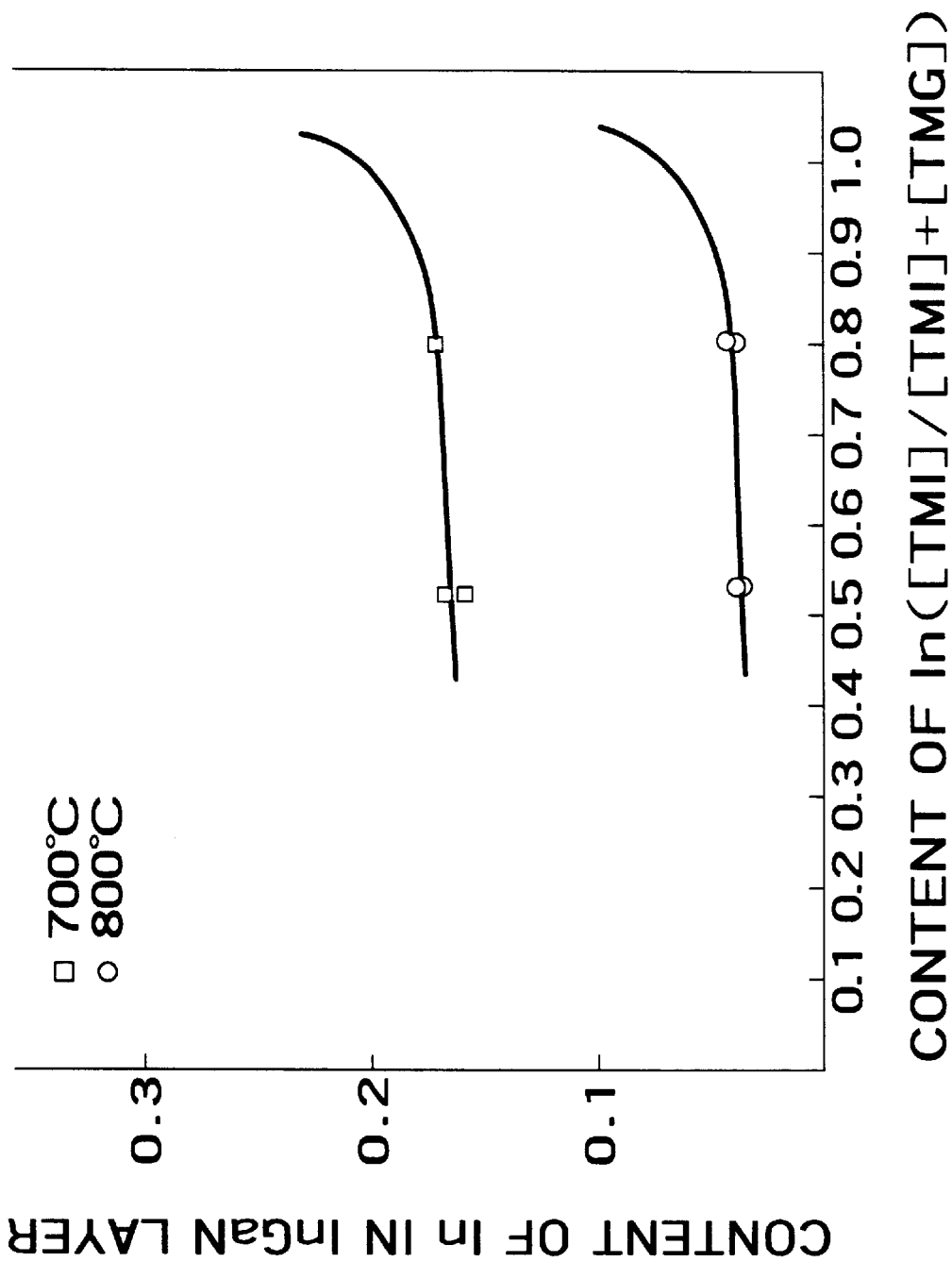
FIG. 8 is a diagram showing a relation between the content of In in the InGaN active layer and the source material gas.

FIG. 8 is a diagram showing a relation between the flow ratio of the source material gas during the crystal growth and the indium content in the InGaN layer obtained. The abscissa is the ratio of the flow rate of the indium source material gas relative to the total source material gas supplied for growth of the InGaN active layer (TMI/TMI+TMG) whereas the ordinate is the indium content in the InGaN layer. It is understood from FIG. 8 thank the In content can be changed by adjusting the ratio of the In source material gas in the total source material gas.

In the first embodiment, the graded layers 14 and 15 with a gradually changed In content are made by utilizing the nature.

As explained above, the first embodiment can overcome deterioration of the interfaces due to interruption of the growth or re-increase of the temperature at the interfaces of the double-heterostructure or a decrease in thickness of the InGaN active layer 15 due to exposing to a high temperature. Therefore, compound semiconductor light emitting elements with a high emission efficiency and good reliability or laser elements with a high slope efficiency and good reliability can be made.

In the above explanation of the embodiment, the double-heterostructure having the InGaN active layer and AlGaN cladding layers is exemplarily shown. However, the invention is not limited to the specific example. As the another example of the embodiment, a double-heterostructure having a similar layered structure as shown in (a) of FIG. 1 with GaNP active layer can tie proposed. In the example, GaNP layers can be employed as the graded layers and AlGaN layers can be employed as the cladding layers. Instead of the AlGaN layers, GaN layers may be employed as the cladding layers. The mole fraction of N (nitride) in the active layer, for example, may be about 0.13. In the GaNP graded layers, the compositions of P (phosphorus) are gradually decreased toward the cladding layers along the growth direction.

The GaP active layer used in the conventional elements is an indirect transition type. In contrast to this, the GaNP active layer in the example is a direct transition type. Therefore, the emission efficiency is much improved and an intense blue-green light can obtained according to the invention.

In the semiconductor light emitting element according to the example, since the GaNP graded layers gradually vayying in content of P (having the graded content) are interposed between the GaNP active layer and the p-type and n-type AlGaN cladding layers, the hetero-interfaces on and under the active layer can be maintained in a good condition. Additionally, by interposing the graded layers, the lattice mismatching between the active layer and the cladding layers are alleviated. Besides, the misfits of the conduction band and the valence band at the hetero-interfaices, which cause the carrier trapping, are alleviated. Therefore, electrons and holes are efficiently confined in the active layer to improve the emission efficiency.

The example promises a semiconductor light emitting element with a higher emission efficiency and reliability of a laser element with a higher slope efficiency and reliability than tho se of conventional elements.

A GaNAs layer or a GaNPAs layer are also employed as the active layer of the structure shown in FIG. 1. In addition to this, any other nitride compound defmed in the specification may be employed as the material of the active layer 15 as well.

Figure 9:
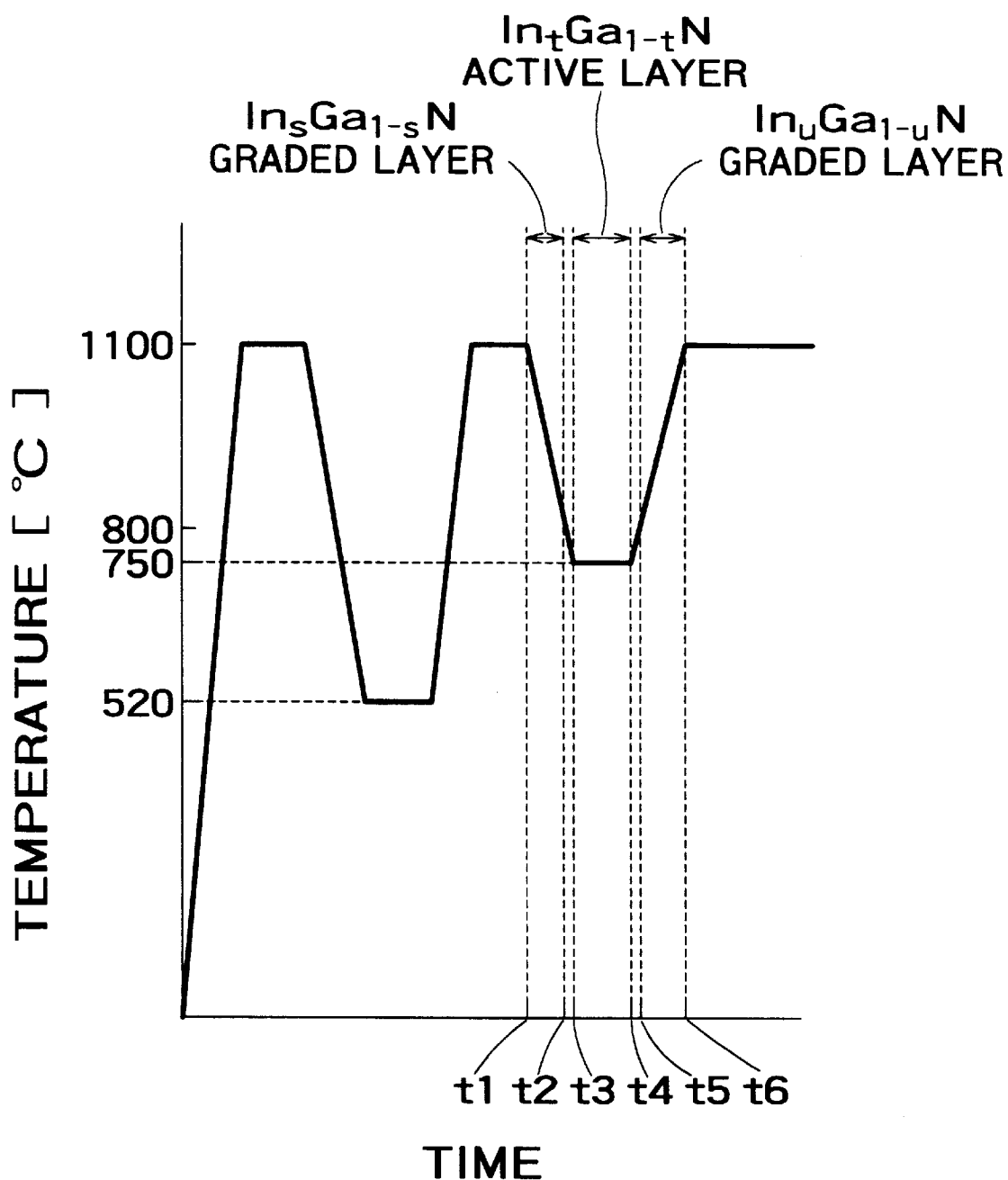
FIG. 9 is a diagram for explaining features of a method for manufacturing the semiconductor light emitting element according to the invention.

Next explained is a manufacturing method according to the second embodiment of the invention with reference to the temperature profile shown in FIG. 9. In the explanation made below, also FIGS. 2 through 7 are referred to for convenience.

A (0001)-oriented sapphire substrate 11 is first introduced into the MOCVD reactor, and heated to 1100°C. under a flow of hydrogen (see FIG. 9). Maintaining the temperature, annealing is performed to clean the sapphire substrate 11. Then, the sapphire substrate 11 is cooled to 520°C. in a mixed atmosphere containing hydrogen and nitrogen, and thle GaN buffer layer 12 is grown to 0.04 $\mu$m on the surface of the sapphire substrate 11 (see FIG. 2).

Figure 3:
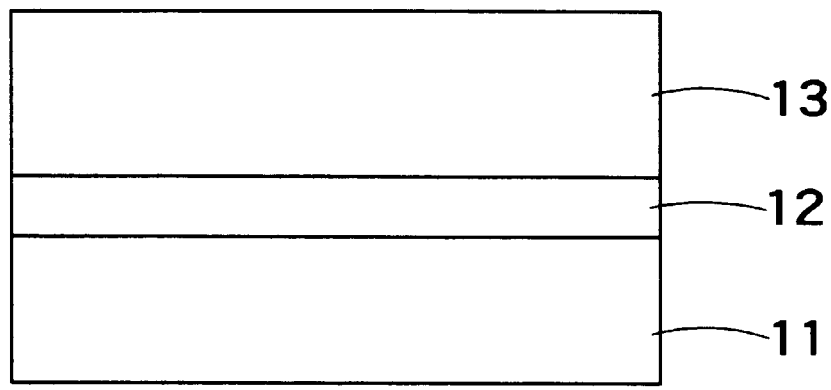
FIG. 3 is a cross-sectional view of the semiconductor light emitting element under a manufacturing process.

After that, the sapphire substrate 11 is heated to and maintainied at 1100°C., and the n-type $Al_yGa_{1-y}N$ cladding layer 13 is grown up to 4 $\mu$m on the surface of the GaN buffer layer 12 (see FIG. 3). Then, maintainig TMI/TMG=33.36/15.20($\mu$mol/min) constant, the $In_uGa_{1-u}N$ graded layer 14 with the progressively increased In content is grown up to 0.1 $\mu$m on the surface of the n-type $Al_yGa_{1-y}N$ cladding layer 13 (see FIG. 4).

The rate of decreasing the temperature is controlled to 13±2°C./min by PID (Proportional Integral Derivative) control. The duration of time therefor is about 23 min.

Thereafter, the supply of TMI and TMG is interrupted, and the sapphire substrate 11 is cooled from 800°C. to 750°C. Maintaining the temperature at 750°C. and using the same TMI/TMG=33.36/15.20($\mu$mol/min), the $In_xGa_{1-x}N$ active layer 15 is grown to 0.05 $\mu$m on the $In_uGa_{1-u}N$ graded layer 14 (see FIG. 5). The duration of time required for growth of the active layer 15 is about 15 minutes.

Then, the supply of TMI and TMG is interrupted again, and the sapphire substrate 11 is heated from 750°C. to 800°C. Thereafter, the supply of TMI and TMG is restarted in the rate of TMI/TMG=33.36/15.20($\mu$mol/min), and while maintaining the flow rate constant, the substrate 11 is heated to 1100°C. to grow the $In_wGa_{1-w}N$ graded layer 16 with the progressively decreased In content up to 0.1 $\mu$m on the surface of the $In_xGa_{1-x}N$ active layer 15 (see FIG. 6). The rate of decreasing the temperature is adjusted to 14±2°C./min by PID control, the duration time therefor is about 21 min.

After that, the supply of TMI is interrupted, and the $Al_zGa_{1-z}N$ cladding layer 17 of 0.15 $\mu$m and the p-type GaN contact layer 18 of 0.3 $\mu$m are grown sequentially on the $In_wGa_{1-w}N$ graded layer 16 under the constant temperature of 1100°C. (see FIG. 7).

Thereafter, the p-side electrode and the n-side electrode (not shown) are formed, the bottom surface of the sapphire substrate is wrapped, the product is cut into pellets by dicing, arnd each pellet is molded in a resin to complete the semiconductor light emitting element.

Features of the second embodiment explained above are briefed below.

1. One of the features lies in growing desired InGaN layers by making a gradient in the In content by increasing and decreasing the temperature while maintaining TMI/TMG constant.

When the graded layer 14 under the active layer 15 is grown, the temperature is decreased under a constant value of TMI/TMG. When the graded layer 16 on the InGaN active layer 15 is grown, the temperature is increased under a constant value of TMI/TMG.

2. Another of the features lies in once fully stopping the supply of TMI and TMG immediately before the growth of the InGaN active layer and, after decreasing the temperature to a value appropriate for growth of the InGaN active layer 15, resuming supply of TMI and TMG by predetermined flow rates to growv the InGaN active layer 15. Additionally, after the InGaN active layer 15 is grown, the flow rate of TMI and TMG are again set to zero for a moment and, after increasing the temperature to a value appropriate for starting the growth of the graded layer 16, these gases are supplied again to growth the graded layer 16.

Figure 10:
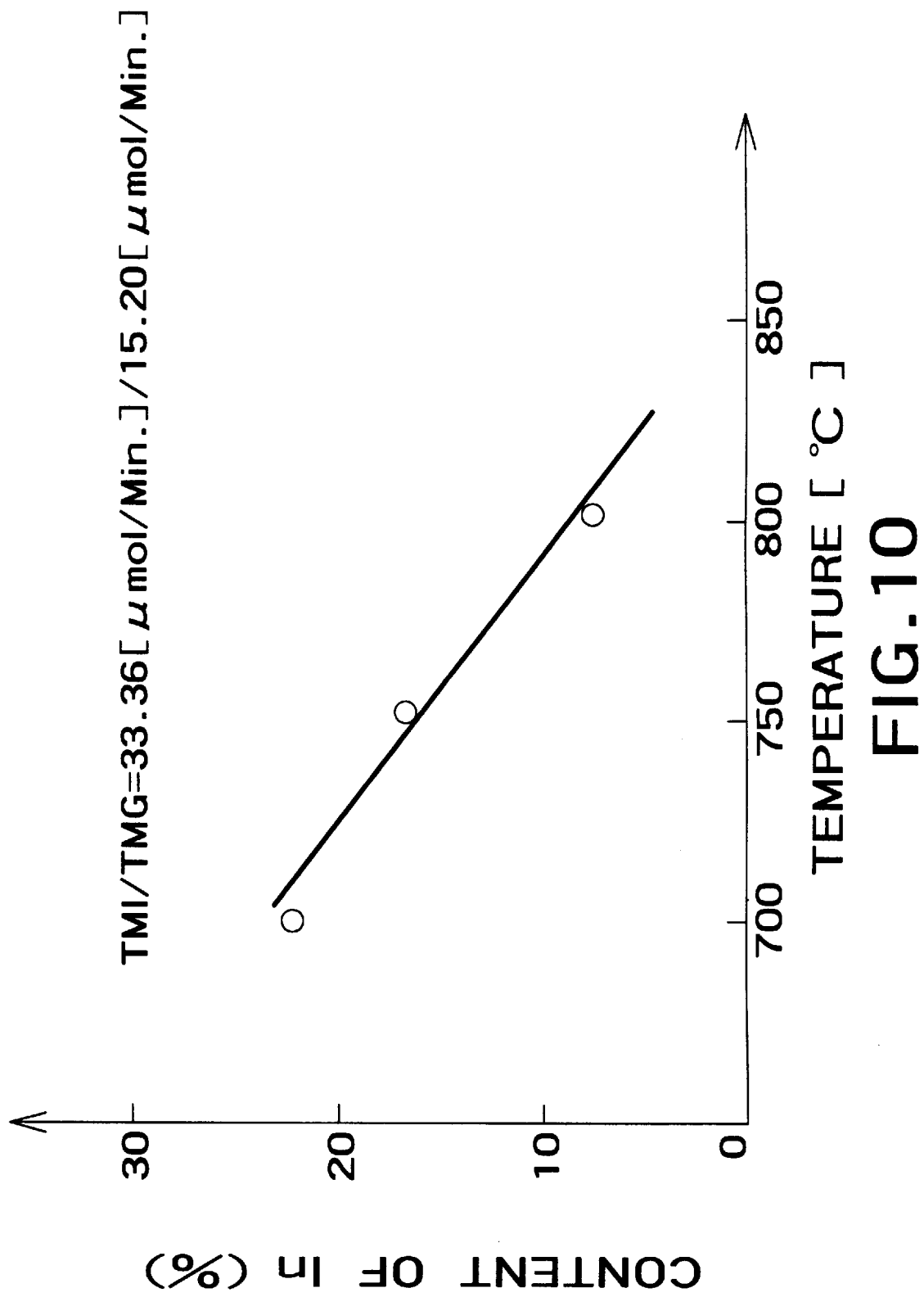
FIG. 10 is a diagram showing a relation between the content of In in the InGaN layer and the growth temperature.

FIG. 10 is a diagram showing a relation between the In content of the InGaN layer and the growth temperature.

Figure 11:
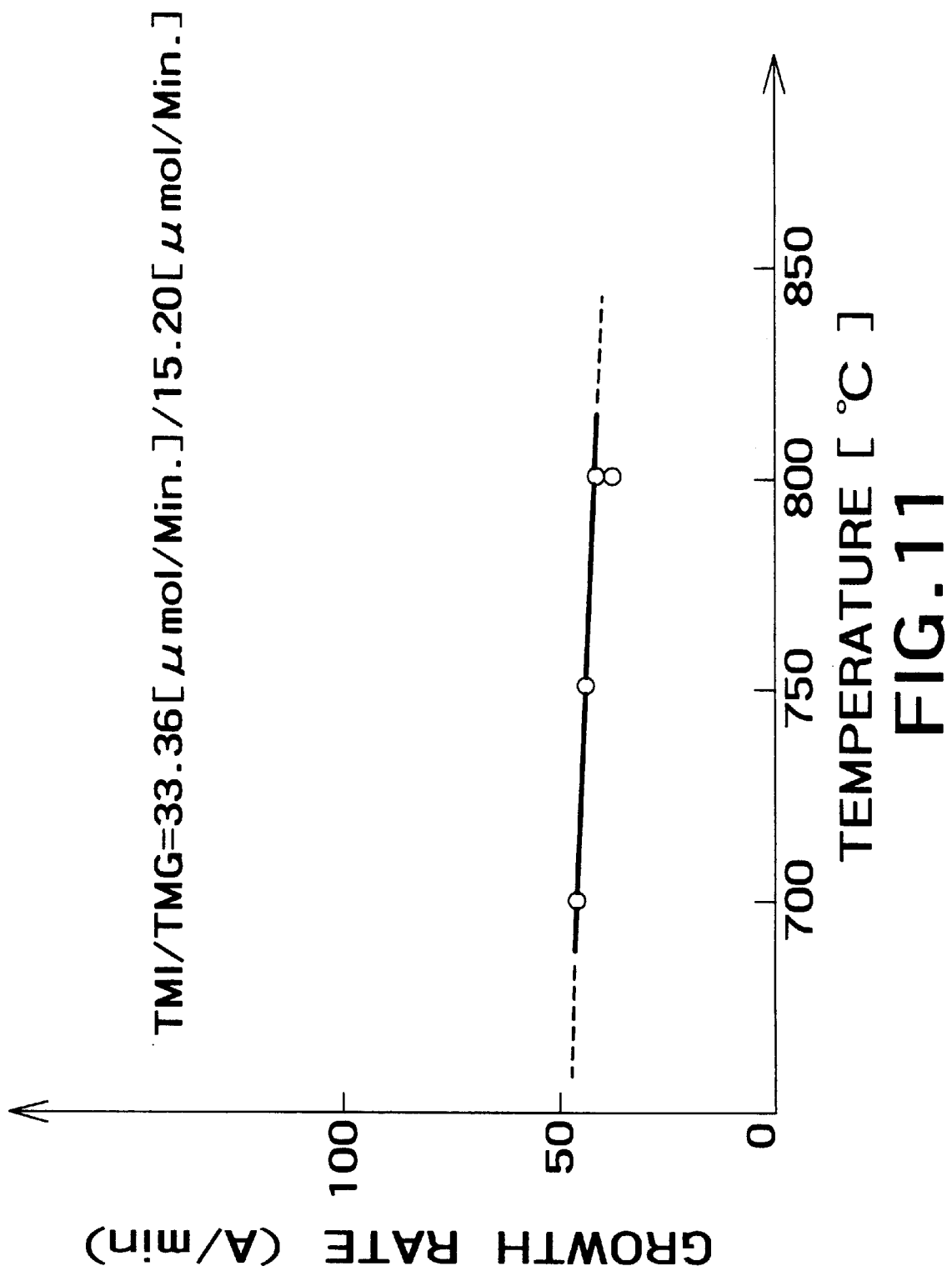
FIG. 11 is a diagram showing changes in growth rate of the InGaN layer with temperature.
Figure 12:
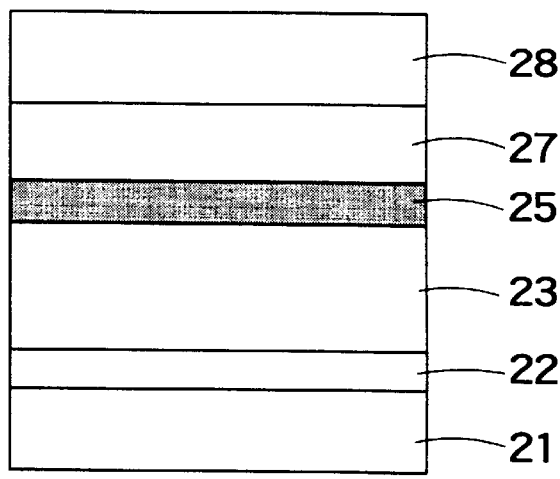
FIG. 12 is a schematic cross-sectional view of a conventional semiconductor light emitting element of a double-heterostructure having a InGaN active layer and AlGaN cladding layers.
Figure 13A:
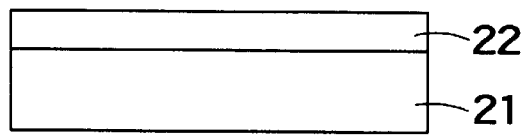
FIGS. 13A, 13B, 13C, through 13D are schematic cross-sectional views of the conventional semiconductor light emitting element shown in FIG. 12 under different steps of a manufacturing process.
Figure 13C:
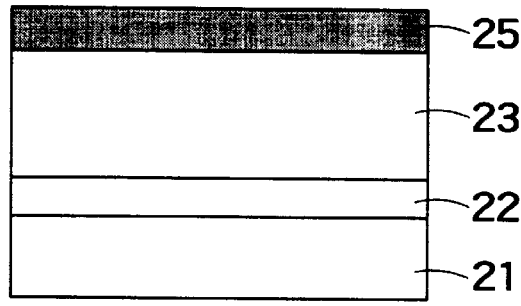
Figure 13B:
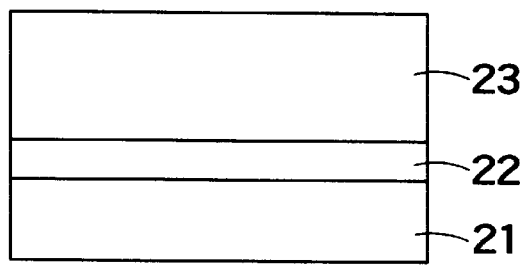
Figure 13D:
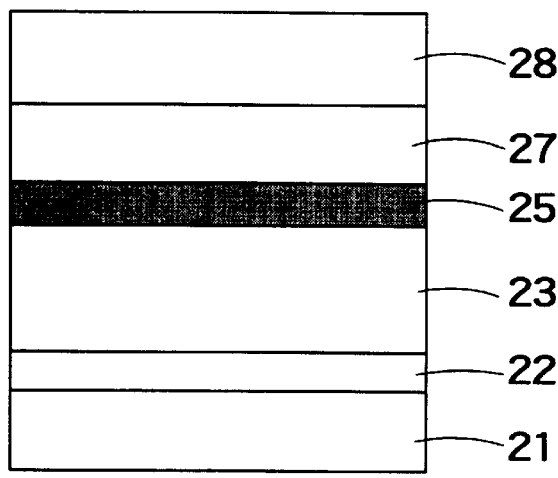

FIG. 11 is a diagram showing changes in growth rate of the InGaN layer with temperature. Both are data obtained under TMI/TMG=33.36/15.20($\mu$mol/min). Under constant supply amounts of TMI and TMG, the indium content in the InGaN layer changes almost linearly with growth temperature, the indium content being higher as the growth temperature becoming lower (see FIG. 10). When the source material gases used are those shown above in the explanation of the embodiment, the growth rate of the InGaN layer depends exclusively on the supply amount of TMG, and is substantially independent of the growth temperature (see FIG. 11). The following effects are obtained from the above-mentioned two features of the second embodiment, respectively.

1. By changing the temperature while maintaining the flow rates of the source material gases constant, InGaN graded layers with desired thicknesses and desired gradients of indium contents can be formed.
2. By once interrupting the source material gases before and after the growth of the active layer 15, it is prevented that tilhe unintentional InGaN layers grow excessively. The interruption duration is set to be fairly short so that the deterioration of the grown surface is prevented. As a result, the hetero-interfaces can be maintained in a good condition.

According to the second embodiment, deterioration at the interfaces of the double-heterostructure and fluctuations in thickness and content of In of the InGaN active layer 15 can be overcome, and a predetermined SCH structure can be made eaLsily and precisely with a good reproducibility only by changing the growth temperature.

Especially, the second embodiment is more excellent than the first embodiment in precise control of the indium conternt in the InGaN graded layers 14 and 16, and promises light emitting elements and laser elements with a higher emission efficiency and better reliability than the first embodiment.

Preferable conditions usable in the second embodiment are shown below.

If nitrogen (N) is used as the group V element in the compound to be grown, then the ratio of the flow rate of the group V source material gas relative to the flow rate of the group III source material gas (V/III ratio) is preferably not lower than 1000 and more preferably not lower than 5000. In contrast with this, the V/III ratio is preferably not lower than 150 in the case of phosphorus (P) and not lower than 50 in the case of arsenic (As). These criteria can be applied to the growth of nitride compound layers including phosphorus (P) and/or arsenic (As).

If the V/III ratio is lower than the above defined criteria, the supply of group V species is not sufficient and the grown layers have crystal defect caused by the lack of group V elements.

If the temperature gradient upon decreasing the temperature is D1 (°C./min), and the temperature gradient upon increasing the temperature is D2 (°C./min), they are preferably determined to satisfy $10 \leq D1 \leq 60$ and $10 \leq D2 \leq 60$. If the temperature gradient is higher than the range, the thermal stress degrades the crystal quality of the grown layers and the crystal quality of the graded layers is also degraded.

If the temperature gradient is lower than the above mentioned range, the crystal quality of the graded layers is degraded because the growth speeds of these layers become too slow. Also the diffuse-out of the dopant is caused because the growth time become too long.

If the growth rate of the graded layer while decreasing the temperature is V1 ($\mu$m/min) and the growth rate of the graded layer while increasing the temperature is V2 ($\mu$m/min) where $0.002 \leq V1 \leq 0.06$ and $0.002 \leq V2 \leq 0.06$, D1 and D2 are preferably determined to satisfy $6 \leq D1 \leq 18$ and $6 \leq D2 \leq 18$.

If the growth rate of the graded layers is out of the above defined range, the problems as explained above may happen.

In the first and second embodiments, indium contents of the InGaN graded layers 14 and 16 represent symmetric gradients. However, the invention is not limited to these specific structures, but the graded layers 14 and 16 may have asymmetric gradients of indium contents.

Asymmetric gradients of indium contents can be made, for example, by changing the ratio of the flow rates of the source material gases or by appropriately determining the temperature gradient and/or amounts (or mole ratio) of source material gases between the process of decreasing the temperature and the process of increasing the temperature. With asymmetric graded layers, substantially the same effects as described above can be obtained.

In the embodiments explained above, the mole ratio of $NH_3$ relative to the group III source material gas is held constant. However, the invention is not limited to this specific method. As another example of the invention, by gradually decreasing $NH_3$ to 5 L/min while the temperature is decreased, and by gradually increasing $NH_3$ to a larger amount than 5L/min while the temperature is increased, InGaN graded layers 14 and 16 with a better crystalline property can be obtained.

The reason of the changing the flow of $NH_3$ is because the optimum V/III ratio depends on the In composition of the growing layer. The optimum V/III ratio of the InGaN having a higher In composition is smaller than the optimum V/III ratio of the InGaN having a lower In composition.

The first and second embodiments have been explained by taking nitride semiconductor light emitting elements containing In. However, the invention is applicable to transistors and other electronic devices as well. Needless to say, it is also applicable to optical devices and electronic devices using compound semiconductors containing In and using phosphorus (P) or arsenic (As) as the group V element.

The foregoing embodiments have been explained as doping impurities into the AlGaN cladding layers 13 and 17 to improve the emission efficiency or to decrease the threshold current significantly. However, the effects intended by the present invention can be obtained also when these cladding layers are undoped (not doped intentionally but may contain residual impurities on the order of $1 \times 10^{14}$ to $1 \times 10^{16} cm^{-3}$).

The material of the substrate 11 need not be sapphire, but an insulating substrate, such as spinel, MgO, $ScAlMgO_4$, $LaSrGaO_4$ or $(LaSr)(AlTa)O_3$, or a conductive substrate, such as SiC, Si, GaAs or GaN, can be used similarly to obtain their own effects. In case of a $ScAlMgO_4$ substrate, its (0001)-oriented surface is preferably used. In case of a $(LaSr)(AlTa)O_3$ substrate, its (111)-oriented surface is preferably used.

It is also possible to use an insulating substrate made of, for example, ZnS, GaSe, $SnO_2$, $CuAlS_2$, CuCl, $CuAlSe_2$, $In_2O_3$, ZnO or quartz, provided an appropriate buffer layer be formed.

The source material gas for nitrogen (N) is not limited to ammonia ($NH_3$). It is also possible to use compounds including hydradine, such as monomethyl hydradine and dimethyl hydradine, as the source material for nitrogen. By using these compounds, the optimum V/III ratio can be decreased because the incorporation efficiency of the nitrogen into the growing layer becomes higher.

Usable as the material of the electrodes are, for example, magnesium (Mg), beryllium (Be), antimony (Sb), aluminum (m), silver (Ag), tin (Sn), copper (Cu), nickel (Ni), gold (Au), palladium (Pd), platinum (Pt), titanium (Ti), chromium (Cr), indium (In), PdSi, PtSi, RhSi, NiSi, WSi, $TaSi_2$, molybdenum (Mo), zirconium (Zr), or their multi-layered films, and metals having a bonding function such as silver paste.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for manufacturing a compound semiconductor element comprising a step of growing a compound semiconductor layer having a gradually changing content of indium along the growth direction by changing the growth temperature while maintaining the supplying ratio of a source material of indium relative to the source materials of the other group III elements in a constant value.

2. The method for manufacturing a compound semiconductor element according to claim 1 wherein said compound semiconductor layer is grown by increasing the growth temperature to gradually decrease the content of indium along the growth direction.

3. The method for manufacturing a compound semiconductor element according to claim 2 wherein a source material of a group V element is further used, and the ratio of the supply amount of the source material of the group V element relative to the supply amount of the source material of the group III element (V/III ratio) is gradually increased.

4. The method for manufacturing a compound semiconductor element according to claim 3 wherein, when said group V element is nitrogen (N), said V/III ratio is not smaller than 1000; when said group V element is phosphorus (P), said V/III ratio is not smaller than 150; and when said group V element is arsenic (As), said V/III ratio is not smaller than 50.

5. The method for manufacturing a compound semiconductor element according to claim 1 wherein said compound semiconductor layer is grown by decreasing the growth temperature to increase the content of indium along the growth direction.

6. The method for manufacturing a compound semiconductor element according to claim 5 wherein a source material of a group V element is further used, and the ratio of the supply amount of the source material of the group V element relative to the supply amount of the group III element (V/III ratio) is gradually decreased within a range having a lower limit of a predetermined value.

7. The method for manufacturing a compound semiconductor element according to claim 6 wherein, when said group V element is nitrogen (N), said predetermined value of the V/III ratio is 1000; when said group V element is phosphorus (P), said predetermined value of the V/III ratio is 150; and when said group V element is arsenic (As), said predetermined value of the V/III ratio is 50.

8. A method for manufacturing a compound semiconductor element comprising:

a first step of growing an $Al_yGa_{1-y}N$ cladding layer ($0 \leq y \leq 1$) of a first conduction type on a substrate at a growth temperature T1;

a second step of growing on said first $Al_yGa_{1-y}N$ cladding layer of the first conduction type an $In_uGa_{1-u}N$ graded layer ($0 \leq u \leq 1$) having a gradually increased content of indium (In) along the growth direction by decreasing the growth temperature from T1 to T2 while supplying a source material of gallium (Ga) and a source material of indium (In) in a substantially constant ratio therebetween;

a third step of growing an $In_xGa_{1-x}N$ active layer ($0 \leq x \leq 1$) at a constant growth temperature T3;

a fourth step of growing an $In_wGa_{1-w}N$ graded layer ($0 \leq w \leq 1$) having a gradually decreased content of indium (In) along the growth direction by increasing the growth temperature from T4 to T5 while supplying a source material of gallium (Ga) and a source material of indium (In) in a substantially constant raltio therebetween; and a fifth step of growing an $Al_zGa_{1-z}N$ cladding layer of a second conduction type different from said first conduction type ($0 \leq z \leq 1$) at a constant growth temperature T5, wherein $x \leq u$, $x \leq w$, $T3 \leq T2 < T1$, and $T3 \leq T4 < T5$.

9. The method for manufacturing a compound semiconductor element according to claim 8 further comprising a step of decreasing the temperature from the temperature T2 to T3 while interrupting the supply of the source material of the group III element between said second step and said third step.

10. The method for manufacturing a compound semiconductor element according to claim 8 further including a step of increasing the temperature from the temperature T3 to T4 while interrupting the supply of the source material of the group III element between said third step and said fourth step.

11. The method for manufacturing a compound semiconductor element according to claim 8 wherein $10 \leq D1 \leq 60$ and $10 \leq D2 \leq 60$ are satisfied where D1 (°C./minute) is the temperature gradient upon decreasing the growth temperature in said second step, and D2 (°C./minute) is the temperature gradient upon increasing the growth temperature in said fourth step.

12. The method for manufacturing a compound semiconductor element according to claim 8 wherein $6 \leq D1 \leq 18$ and $6 \leq D2 \leq 18$ are satisfied when $0.002 \leq V1 \leq 0.006$ and $0.002 \leq V2 \leq 0.006$ where V1 (μm/minute) is the growth rate of said graded layer in said second step, D1 (°C./minute) is the temperature gradient upon decreasing the growth temperature in said second step, V2 (μm/minute) is the growth rate of said graded layer in said fourth step, and D2 (°C./minute) is the temperature gradient upon increasing the growth temperature in said fourth step.

13. The method for manufacturing a compound semiconductor element according to claim 8 wherein said first step through said fifth step are performed by using a metalorgailic chemical vapor deposition.

14. The method for manufacturing a compound semiconductor element according to claim 13 wherein said substrate is made of sapphire.

* * * * *